United States Patent
Jin et al.

(10) Patent No.: US 10,607,680 B2
(45) Date of Patent: Mar. 31, 2020

(54) SEMICONDUCTOR DEVICE AND METHOD FOR CONTROLLING A REFRESH OPERATION AND A MEMORY SYSTEM INCLUDING THE SAME

(71) Applicant: SK hynix Inc., Icheon-si, Gyeonggi-do (KR)

(72) Inventors: Youngjae Jin, Seoul (KR); Joonwoo Kim, Seoul (KR); Youngook Song, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 81 days.

(21) Appl. No.: 15/985,085

(22) Filed: May 21, 2018

(65) Prior Publication Data

US 2018/0342284 A1    Nov. 29, 2018

(30) Foreign Application Priority Data

May 26, 2017  (KR) .................. 10-2017-0064947

(51) Int. Cl.
*G06F 12/00*  (2006.01)
*G11C 11/406*  (2006.01)
(Continued)

(52) U.S. Cl.
CPC ...... *G11C 11/40615* (2013.01); *G06F 11/004* (2013.01); *G06F 11/106* (2013.01);
(Continued)

(58) Field of Classification Search
CPC .......... G11C 11/40615; G11C 11/4087; G11C 11/40618; G11C 11/40622; G11C 29/783; G06F 11/004

See application file for complete search history.

(56) References Cited

U.S. PATENT DOCUMENTS 4,964,129 A  10/1990 Bowden, III et al.
6,560,725 B1  5/2003 Longwell et al.
(Continued)

FOREIGN PATENT DOCUMENTS

KR  1020130117198 A  10/2013

OTHER PUBLICATIONS

Bhati et al., "Flexible auto-refresh: Enabling scalable and energy-efficient DRAM refresh reductions", Proc. ACM/IEEE 42nd Annu. Int. Symp. Comput. Archit., Jun. 13-17, 2015, pp. 235-246, IEEE, Portland, OR, USA.

*Primary Examiner* — Shawn X Gu
(74) *Attorney, Agent, or Firm* — William Park & Associates Ltd.

(57) ABSTRACT

In an embodiment a semiconductor device may include a weakness detector configured to manage error occurrence information by dividing the memory device into a plurality of areas, to control a first refresh period for a first refresh request at each of the plurality of areas based on the error occurrence information and to generate a second refresh request for a second refresh address included in each of the plurality of areas based on the error occurrence information, and a refresh controller configured to generate a first refresh command according to the first refresh period and output the first refresh command to the memory device and to output a second refresh command and the second refresh address to the memory device according to the second refresh request and the second refresh address.

26 Claims, 16 Drawing Sheets

(51) Int. Cl.
*G06F 11/00* (2006.01)
*G11C 11/408* (2006.01)
*G06F 13/16* (2006.01)
*G06F 11/10* (2006.01)

(52) U.S. Cl.
CPC .......... *G06F 13/16* (2013.01); *G11C 11/4087* (2013.01); *G11C 11/40611* (2013.01); *G11C 11/40618* (2013.01); *G11C 2211/4062* (2013.01)

(56) References Cited

U.S. PATENT DOCUMENTS

| | | |
|---|---|---|
| 9,076,499 B2 | 7/2015 | Schoenborn et al. |
| 2005/0099868 A1 | 5/2005 | Oh |
| 2010/0332900 A1 | 12/2010 | Yang |
| 2014/0164820 A1 | 6/2014 | Franceschini et al. |
| 2016/0163373 A1* | 6/2016 | Hyun .................. G11C 11/4087 365/189.05 |

* cited by examiner

FIG. 4

| EC | FLAG | R2P |
|---|---|---|
| <=1 | F | 0 |
| 2 | F | tREF/2 |
| 3 | F | tREF/4 |
| 4 | F | tREF/8 |
| >=5 | T | 0 |

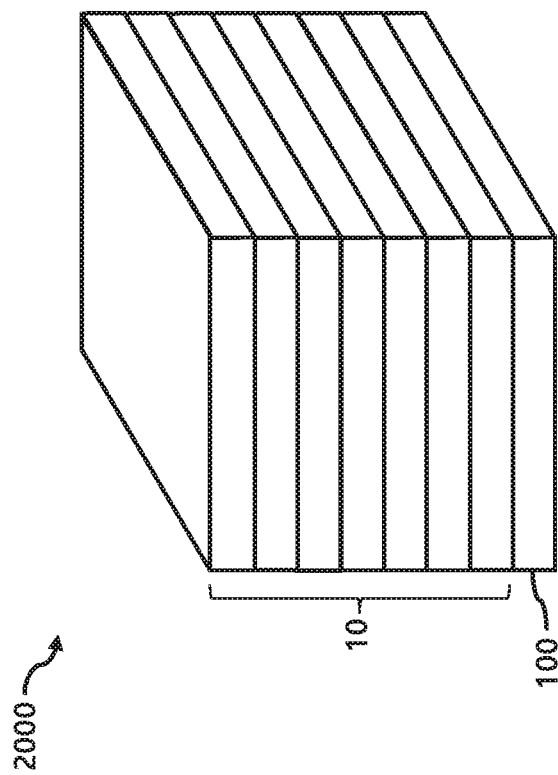

SEMICONDUCTOR DEVICE AND METHOD FOR CONTROLLING A REFRESH OPERATION AND A MEMORY SYSTEM INCLUDING THE SAME

CROSS-REFERENCE TO RELATED APPLICATIONS

The present application claims priority to Korean Patent Application No. 10-2017-0064947, filed on May 26, 2017, which is incorporated herein by reference in its entirety.

BACKGROUND

1. Technical Field

Various example embodiments may generally relate to a semiconductor device and method for dynamically controlling a refresh operation and a memory system including the semiconductor device.

2. Related Art

A memory device, such as a DRAM, prevents stored data from being lost through a refresh operation.

The average cell in the DRAM has a sufficiently long data retention time, but the data retention time of marginal cells is short.

Conventional DRAMs perform refresh operations based on a cell having a short data retention time, thereby stably maintaining the entire data set.

However, based on the average cell, a refresh operation is performed unnecessarily frequently, resulting in unnecessary power consumption.

Also, when an auto-refresh command is provided to the memory device from a memory controller, the time that an auto-refresh command occupies the command bus is increased, resulting in lower data bus utilization.

In addition, in a conventional memory device, a refresh period is fixed during use of the memory device and data failure cannot be avoided despite the refresh operation when the data retention characteristics of a cell deteriorate during use of the memory device.

SUMMARY

In an embodiment, a semiconductor device may include a scrubbing circuit configured to perform a scrubbing operation for a memory device in reference to corrected data output from an ECC circuit; a weakness detector configured to manage error occurrence information by dividing the memory device into a plurality of areas based on an address where an error occurred where the address is output from the scrubbing circuit, to control a first refresh period for a first refresh request at each of the plurality of areas based on the error occurrence information, and to generate a second refresh request for a second refresh address included in each of the plurality of areas based on the error occurrence information; and a refresh controller configured to generate a first refresh command according to the first refresh period and output the first refresh command to the memory device and to output a second refresh command and the second refresh address to the memory device according to the second refresh request and the second refresh address.

In an embodiment, a memory system may comprise a memory device; and a semiconductor device. In the memory system, the semiconductor device may include a weakness detector configured to manage error occurrence information by dividing the memory device into a plurality of areas based on an address where an error has occurred output from the scrubbing circuit, to control a first refresh period for a first refresh request at each of the plurality of areas based on the error occurrence information and to generate a second refresh request for a second refresh address included in each of the plurality of areas based on the error occurrence information; and a refresh controller configured to generate a first refresh command according to the first refresh period, output the first refresh command to the memory device, output a second refresh command and the second refresh address to the memory device according to the second refresh request and the second refresh address.

In an embodiment, a semiconductor device may be configured to partition a memory device into a plurality of areas, to adjust a first refresh period for each of plurality of areas, to generate a second refresh request for a second refresh address included in each of the plurality of areas, to generate a first refresh command and output the first refresh command according to the first refresh period, and to generate and output a second refresh command and a second refresh address to the memory device according to the second refresh request and the second refresh address.

BRIEF DESCRIPTION OF THE DRAWINGS

FIG. 4 is a diagram illustrating a method of adjusting a $2^{nd}$ refresh period according to an embodiment of the present disclosure.

FIG. 16 is a diagram of a stacked memory device including a semiconductor device according to an embodiment of the present disclosure.

DETAILED DESCRIPTION

Various embodiments will be described below with reference to the accompanying drawings.

Figure 1:
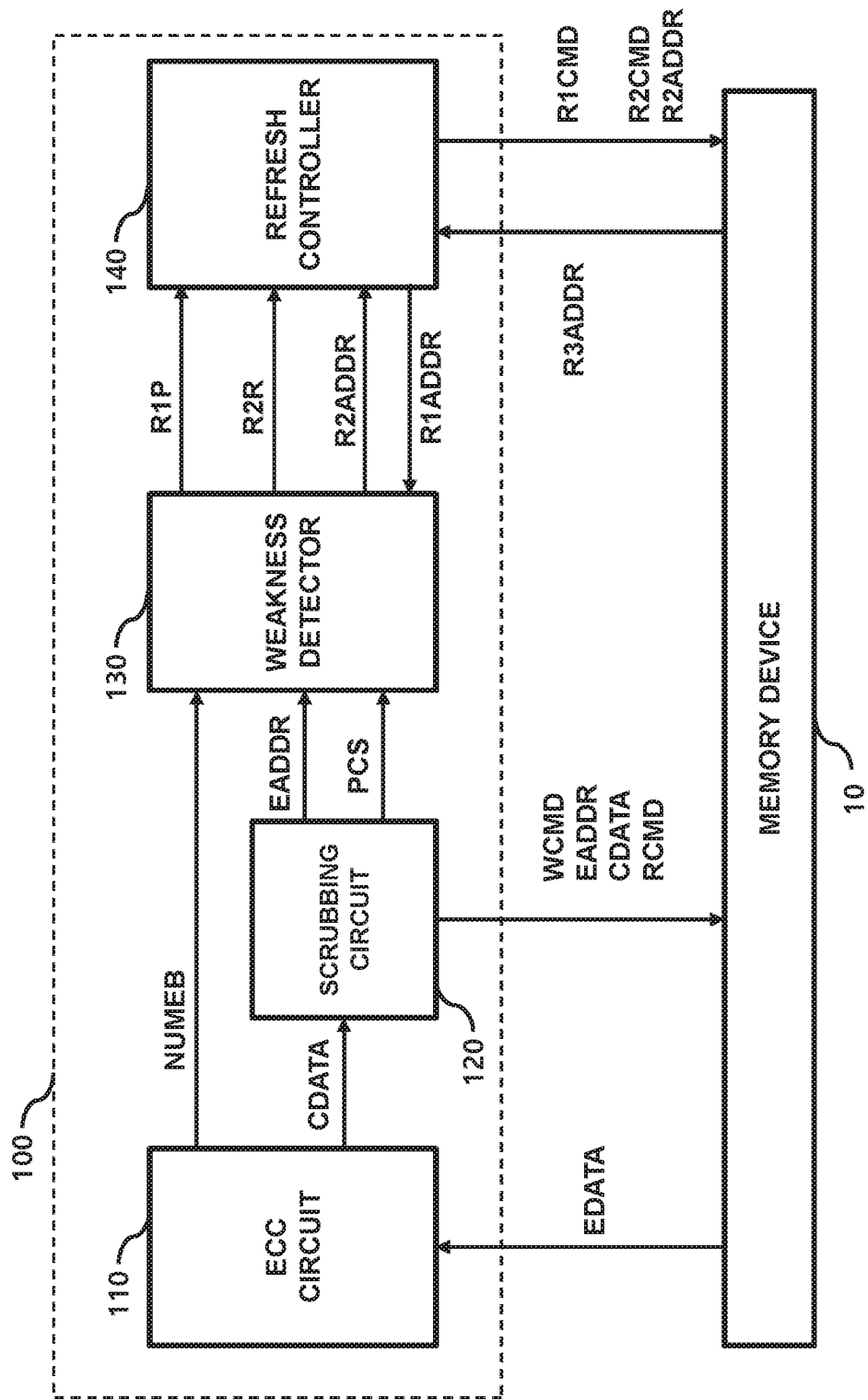
FIG. 1 is a block diagram illustrating a memory system including a semiconductor device in accordance with an embodiment of the present disclosure.

FIG. 1 is a block diagram illustrating a memory system including a semiconductor device and a memory device in accordance with an embodiment of the present disclosure.

The semiconductor device 100 according to an embodiment of the present invention includes an error checking and correcting (ECC) circuit 110, a scrubbing circuit 120, a weakness detector 130 or weakness detector circuit, and a refresh controller 140 or refresh controller circuit.

The ECC circuit 110 determines whether data output from the memory device 10 is erroneous.

The ECC circuit 110 provides the number of error bits NUMEB to the weakness detector 130 and provides the corrected data CDATA to the scrubbing circuit 120.

The maximum number of error bits that can be corrected in the ECC circuit 110 may be provided in advance to the weakness detector 130.

The scrubbing circuit 120 divides the memory device 10 into a plurality of areas and performs a scrubbing operation. A scrubbing operation may refer to periodically or otherwise reading data, correcting any correctable errors in the read data, and writing the corrected data back to memory.

In this embodiment, it is assumed that one area corresponds to one rank, and accordingly, a scrubbing operation is performed on a rank basis.

In another embodiment, the memory device 10 may be divided into various kinds of areas such as channels, banks, and the like.

The scrubbing circuit 120 sequentially or randomly performs a scrubbing operation on addresses included in a rank.

In the present embodiment, the scrubbing circuit 120 provides a read command RCMD to the memory device 10 from the first address to the last address of a rank. The ECC circuit 110 determines if data read from the memory device 10 includes an error. If the data contains an error (i.e., there is error data EDATA) the ECC circuit 110 provides corrected data CDATA to the scrubbing circuit 120. The scrubbing circuit 120 provides a write command WCMD to the memory device 10 to write the corrected data CDATA to the address EADDR where the error occurred.

In a scrubbing operation, the scrubbing circuit 120 provides the address EADDR which indicates to the weakness detector 130 where the error occurred.

When the scrubbing operation is completed for all the addresses of the rank, the scrubbing circuit 120 provides a patrol completion signal PCS to the weakness detector 130.

The weakness detector 130 manages error occurrence information for each rank.

The error occurrence information may include an address where an error occurred, the number of errors that occurred, whether an uncorrectable error occurred, and the like.

When the scrubbing circuit 120 outputs a patrol completion signal PCS, the weakness detector 130 refers to the error occurrence information and controls a first refresh period field R1P for a first refresh request at a corresponding rank.

The patrol completion signal PCS is activated when a scrubbing operation is performed at least once for all addresses in a rank.

Here, a first refresh operation performed by the first refresh request may refer to an auto-refresh operation performed in each rank.

The weakness detector 130 may refer to error occurrence information to request a second refresh for a specific address.

The second refresh may be referred to as a pseudo-refresh because the second refresh has a similar effect to performing a refresh operation on a specific address by performing an active operation on a word line corresponding to the specific address.

The weakness detector 130 may adjust the time to request the second refresh according to the error occurrence information.

The weakness detector 130 provides the first refresh period field R1P and the second refresh request R2R to the refresh controller 140 for each rank.

The refresh controller 140 provides the memory device 10 with a first refresh command R1CMD for a corresponding rank according to the first refresh period field R1P provided by the weakness detector 130.

The refresh controller 140 provides a second refresh command R2CMD and a second refresh address R2ADDR to the memory device 10 according to the second refresh request R2R and the second refresh address R2ADDR provided by the weakness detector 130.

The memory device 10 performs a first refresh operation, that is, an auto-refresh operation, in accordance with the first refresh command R1CMD.

The memory device 10 manages the first refresh address information and may perform an auto-refresh on the next most recently refreshed address when the first refresh command is applied.

The memory device 10 performs a pseudo-refresh operation to execute an active operation on a corresponding address according to a second refresh command R2CMD and an address R2ADDR.

The memory device 10 may perform a third refresh operation without an instruction from the semiconductor device 100 in a low power state, which may be referred to as self-refresh.

The memory device 10 may finally provide the refresh controller 140 with the address R3ADDR where the third refresh has been performed last.

The refresh controller 140 synchronizes information on the refresh address with the memory device 10 using the address R3ADDR provided from the memory device 10.

Accordingly, the refresh controller 140 and the memory device 10 store the most recently refreshed address in synchronization.

When the first refresh command R1CMD is output, the refresh controller 140 provides the address R1ADDR on which the first refresh operation is to be performed, that is, the first refresh address, to the weakness detector 130.

The weakness detector 130 may control the time to request a second refresh operation for a corresponding address by referring to the first refresh address R1ADDR.

Figure 2:
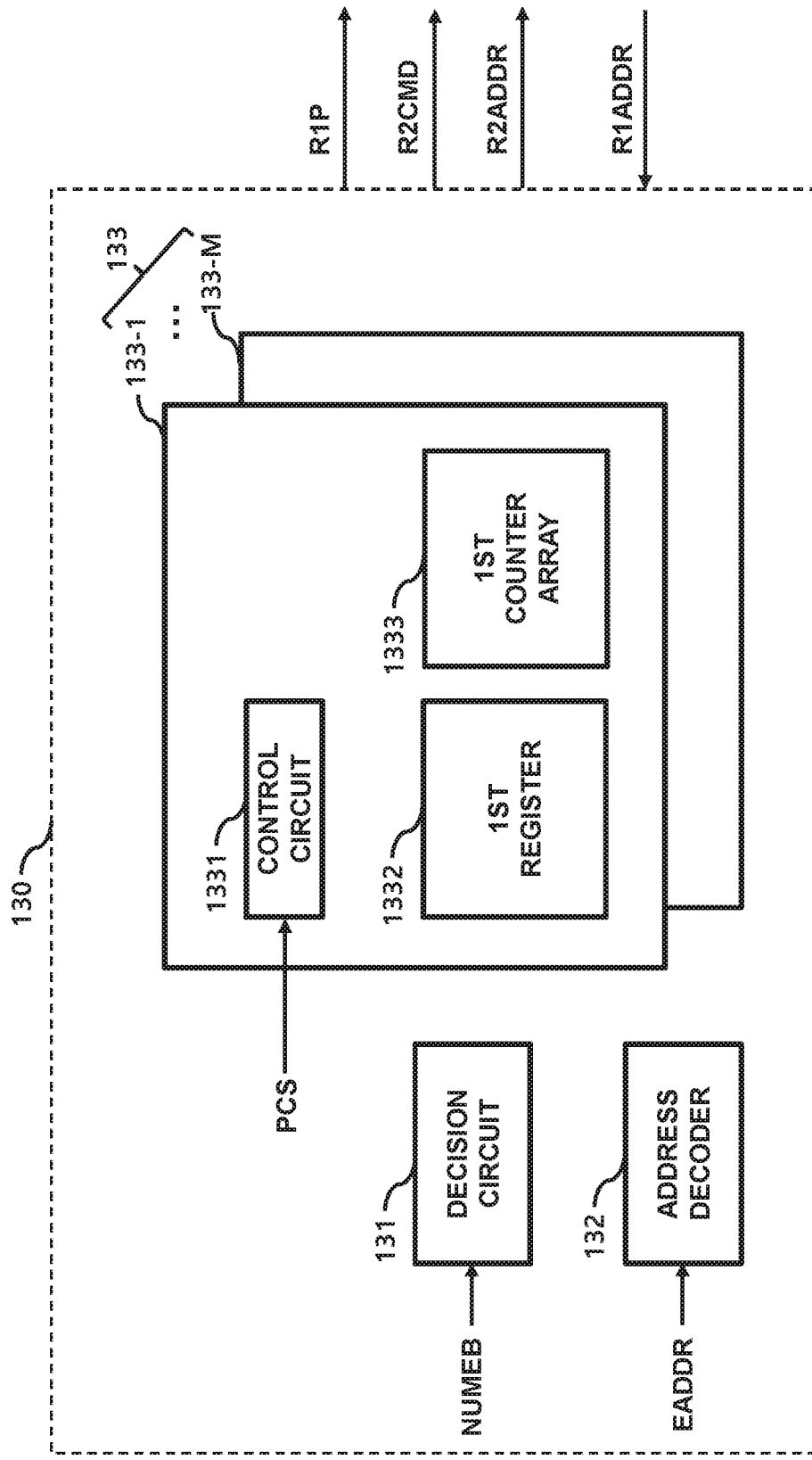
FIG. 2 is a block diagram illustrating a weakness detector according to an embodiment of the present disclosure.

FIG. 2 is a block diagram illustrating a weakness detector 130 according to an embodiment of the present disclosure.

The weakness detector 130 includes a decision circuit 131, an address decoder 132, and a detection circuit 133.

The decision circuit 131 can decide whether an error has occurred in the current address by checking the number of error bits NUMEB and can decide whether the error that has occurred can be corrected.

If the number of error bits NUMEB is 0, the decision circuit 131 may determine that no error has occurred. If the number of error bits is 1 or more, the decision circuit 131 may determine that an error has occurred.

The decision circuit 131 may also determine whether an error can be corrected by comparing the number of error bits NUMEB with the maximum number of error bits that can be corrected by the ECC circuit 110.

If the decision circuit 131 determines that the address cannot be corrected, it is preferable that the address is processed as a failed address and a repair operation is therefore performed for the failed address using a redundancy circuit.

The configuration for the repair operation of the memory device 10 is outside the scope of the present invention. Therefore, a detailed description thereof will be omitted.

The weakness detector 130 may provide the failed address information for performing a repair operation inside or outside the semiconductor device 100 to perform a repair operation for the memory device 10.

The address where the error occurred and the number of error bits NUMEB are provided to the detection circuit 133.

The address decoder 132 identifies the rank to which the address EADDR where an error has occurred belongs.

The detection circuit 133 includes a plurality of sub-detection circuits 133-1, ..., 133-M.

The configuration of the plurality of sub-detection circuits is substantially the same and each performs a weakness detection operation on a corresponding rank.

The sub-detection circuit 133-1 may include a control circuit 1331, a first register 1332, and may further include a first counter array 1333.

Figure 3:
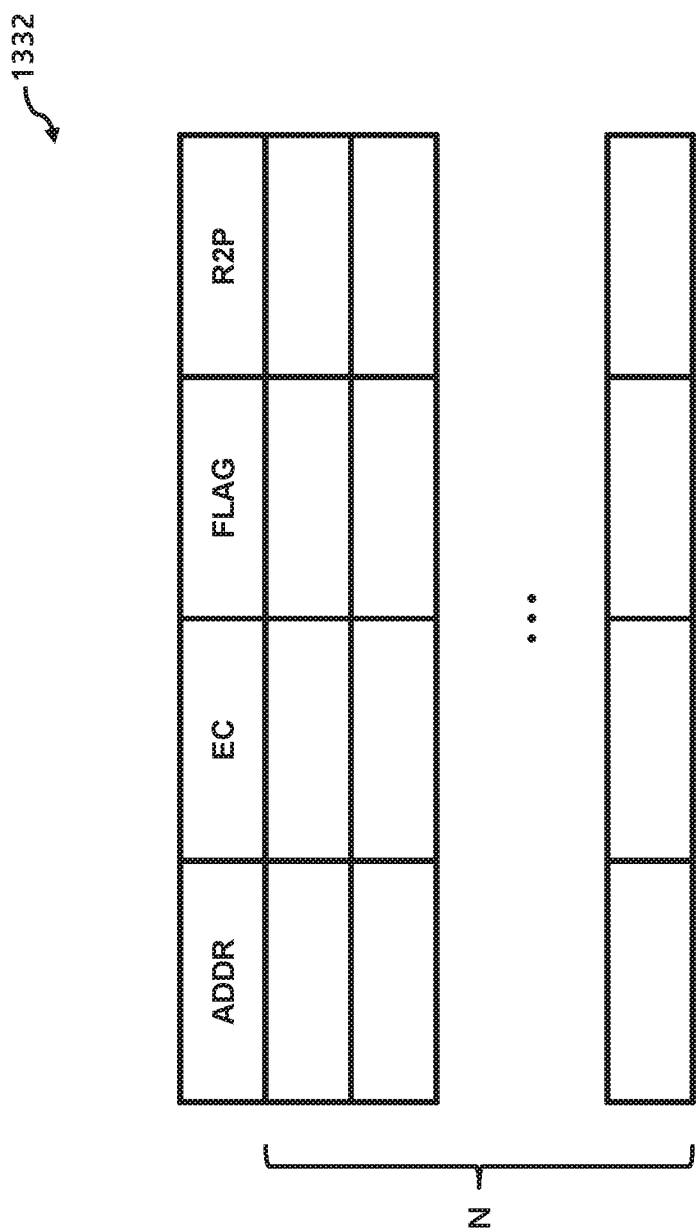
FIG. 3 is a block diagram illustrating a $1^{st}$ register according to an embodiment of the present disclosure.

FIG. 3 is a block diagram illustrating a $1^{st}$ register 1332 according to an embodiment of the present disclosure.

The first register 1332 includes an address field ADDR, an error count field EC, a flag field FLAG, and a second refresh period field R2P.

In this embodiment, it is assumed that the first register 1332 has N (N is a natural number) entries.

The address field ADDR indicates an address where an error occurred. The address where the error occurred may be referred as an error address EADDR. The address stored in the address field may include the remainder except for the rank address.

The type of address stored in the address field can be variously set according to the embodiment.

For example, the address stored in the address field ADDR may be a bank group address, a bank address, a row address, or a cell address.

Hereinafter, the address stored in the address field may be a row address.

The error count field EC accumulates and stores the number of errors that occurred at a corresponding address of the address field ADDR.

If the row address is already stored in the address field ADDR, the row address is extracted from the error address EADDR, and the error count is stored in the error count field EC of the entry associated with the extracted row address.

If the extracted row address is not in the address field ADDR, the row address and error count are added to an empty entry.

In the absence of an empty entry, the first register 1332 may output an overflow signal.

The flag field FLAG stores information indicating whether the address of the address field is an address that has been repaired.

The flag information can be activated when an uncorrectable error occurs as described above.

Even if an uncorrectable error has not occurred, it may be desirable to repair an address where errors frequently occur through a redundancy circuit. Accordingly, the flag information can be activated when the number of errors is greater than or equal to a predetermined value.

The second refresh period field R2P stores the period that the second refresh is to be performed on the address where the error occurred.

At this time, the second refresh period may be stored as a corresponding counter value.

In this embodiment, the second refresh period can be determined using the error count and the first refresh period tREF.

FIG. 4 is a diagram illustrating a method to adjust a $2^{nd}$ refresh period according to an embodiment of the present disclosure.

FIG. 4 shows a relationship between the error count, the flag, and the second refresh period used in this embodiment. The specific contents of FIG. 4 can be variously changed according to an embodiment.

When the error count is one or less, the second refresh period is set to zero. In the present embodiment, 0 indicates that the second refresh operation is not performed.

When the error count is 2, the second refresh period corresponds to ½ of the first refresh period tREF.

For example, if the counter value corresponding to the first refresh period tREF is 10,000, 5000 can be stored in the second refresh period field.

This means that the second refresh operation is performed on the address where the error occurs once in the middle of an auto-refresh.

When the error count is 3, the second refresh period is set to ¼ of the first refresh period tREF.

For example, if the counter value corresponding to the first refresh period tREF is 10,000, 2500 can be stored in the second refresh period field.

This means that the second refresh operation is performed on the address where the error occurs three times in the middle of an auto-refresh.

When the error count is 4, the second refresh period is set to ⅛ of the first refresh period tREF.

This means that the second refresh operation is performed on the address where the error occurs seven times in the middle of an auto-refresh.

For example, if the counter value corresponding to the first refresh period tREF is 10,000, 1250 can be stored in the second refresh period field.

If the error count is 5 or more, the flag is activated so that the address is repaired by the redundancy circuit.

The control circuit 1331 controls the first refresh period tREF by referring to the first register 1332 when receiving the patrol completion signal PCS for the rank from the scrubbing circuit 120.

When the first refresh period tREF is adjusted, the value of the second refresh period field of the first register 1332 may be updated together with the adjusted first refresh period tREF.

For example, when the number of entries in which data is stored in the first register 1332 is greater than or equal to the first value, the control circuit 1331 regards the retention time tRET characteristic of the corresponding rank as degraded and the first refresh period tREF may be modified to a value smaller than the existing value.

For example, when the number of entries in which the data is stored in the first register 1332 is less than or equal to the second value which may be smaller than the first value, the control circuit 1331 regards the retention time tRET characteristic of the corresponding rank as excellent and the first refresh period tREF may be modified to a value greater than the existing value.

If the number of entries in which the data is stored in the first register 1332 is between the first value and the second value, the control circuit 1331 may maintain the first refresh period.

The first refresh period may be variously changed according to the embodiment. For example, the first refresh period may be adjusted in consideration of the total number of errors occurring in a rank.

In another example, the first refresh period may be adjusted in consideration of an environment of the memory device such as temperature or voltage.

Those of ordinary skill in the art will be able to make various design modifications to the method of changing the first refresh period with reference to this disclosure.

Figure 5:
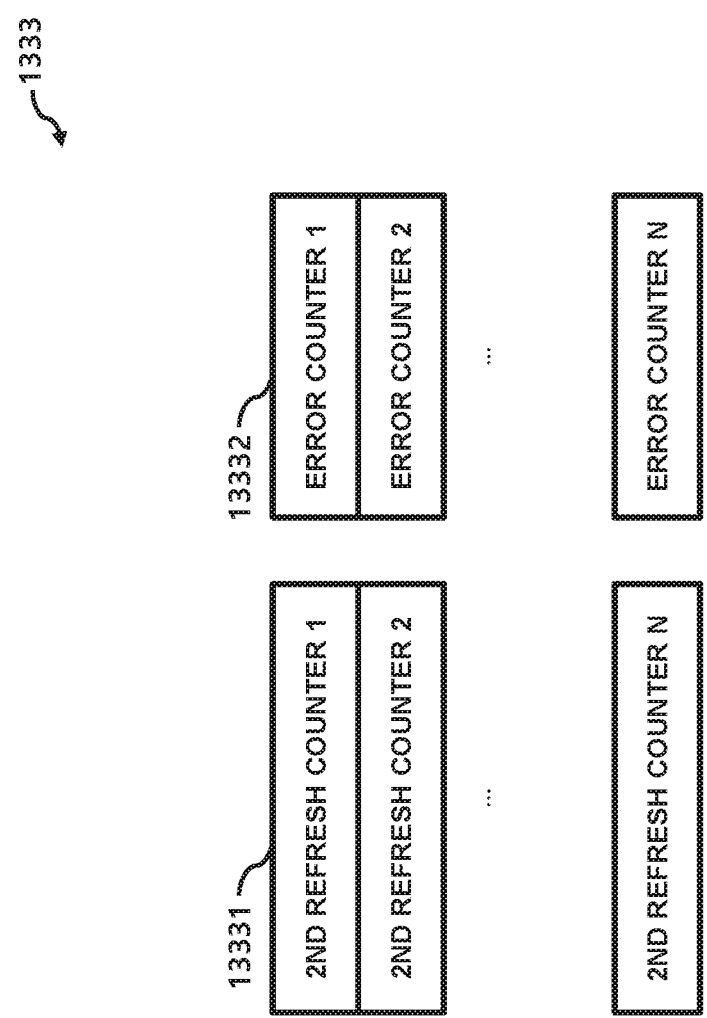
FIG. 5 is a block diagram illustrating a $1^{st}$ counter array according to an embodiment of the present disclosure.

FIG. 5 is a block diagram illustrating a $1^{st}$ counter array 1333 according to an embodiment of the present disclosure.

The first counter array 1333 includes a second refresh counter 13331.

The number of second refresh counters 13331 may be as same as the number of entries in the first register 1332. In this case, each second refresh counter 13331 may be assigned to an entry of the first register 1332 in a 1:1 manner.

The second refresh counter 13331 counts a value set by the second refresh period of the corresponding entry, and outputs a count completion signal when the count is completed.

When the count completion signal is output, the weakness detector 130 outputs a second refresh request R2R to the address of the entry corresponding to the refresh controller 140.

When the refresh controller 140 outputs the first refresh command R1CMD to the memory device 10, the refresh controller 140 provides the first refresh address R1ADDR corresponding to the first refresh command R1CMD to the weakness detector 130.

Then the weakness detector 130 searches the first register 1332 for an entry corresponding to the first refresh address R1ADDR.

If an entry corresponding to the first refresh address is found, the second refresh counter 13331 corresponding to the entry is initialized.

Accordingly, it is possible to prevent the second refresh operation from being redundantly performed with respect to the address where the first refresh operation is performed.

The first counter array 1333 may further include a plurality of error counters 13332.

The number of error counters 13332 may be the same as the number of entries in the first register 1332, and in this case, each error counter 13332 entry may correspond to one entry in the first register 1332 in a 1:1 manner.

In the event of an error occurrence, the error counter 13332 may increase the value of the error counts present in the corresponding entry of the first register 1332.

The error count field of the first register 1332 may be updated to a value increased by the corresponding error counter 13332.

Figure 6:
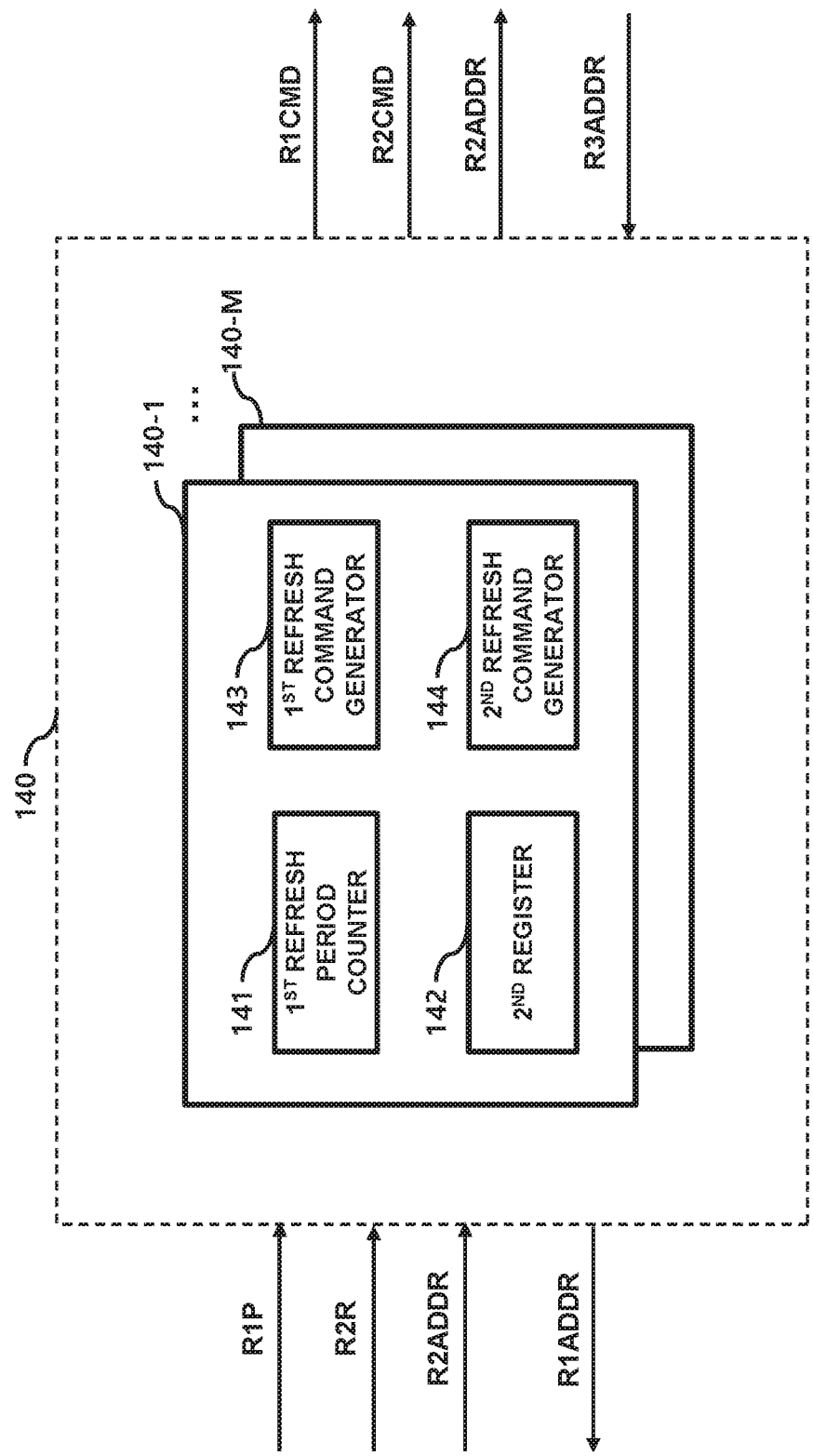
FIG. 6 is a block diagram illustrating a refresh controller according to an embodiment of the present disclosure.

FIG. 6 is a block diagram illustrating a refresh controller 140 according to an embodiment of the present disclosure.

The refresh controller 140 includes a plurality of sub-refresh controllers 140-1, . . . , and 140-M.

Each of the plurality of sub-refresh controllers has substantially the same configuration, and each performs a refresh control operation for a corresponding rank.

The sub-refresh control controller 140-1 includes a first refresh period counter 141, a second register 142, a first refresh command generator 143, and a second refresh command generator 144.

The first refresh period counter 141 counts a value corresponding to a period during which the first refresh command is output based on the first refresh period tREF from the weakness detector 130.

For example, when the first refresh period counter 141 counts a value corresponding to a unit refresh period tREFI that is a value obtained by dividing the first refresh cycle tREF by the number of addresses included in the rank, the first refresh command generator 143 outputs the first refresh command R1CMD.

The second register 142 stores the most recently refreshed address and updates the value of the second register 142 to the next address of the existing address after outputting the first refresh command R1CMD from the first refresh command generator 143.

Because the memory device 10 also stores the most recently refreshed address, when the memory device 10 receives the first refresh command R1CMD, the memory device 10 performs the first refresh operation for the next address and updates the information of the most recently refreshed address.

As described above, the memory device 10 can perform a self-refresh (third refresh) operation by itself in a low power state.

When terminating the self-refresh operation, the memory device 10 stores the final third refresh address R3ADDR and outputs the address R3ADDR to the refresh controller 140, where the final third refresh address R3ADDR may correspond to the address most recently refreshed by the self-refresh operation.

The refresh controller 140 updates the value of the second register 142 with the final third refresh address R3ADDR.

Accordingly, the second register 142 and the memory device 10 store the most recently refreshed address in synchronization with each other.

When the first refresh command generator 143 outputs the first refresh command R1CMD, the first refresh address R1ADDR corresponding to the first refresh command R1CMD is output to the weakness detector 130.

As described above, when receiving the first refresh address R1ADDR, the weakness detector 130 determines whether a corresponding entry exists in the first register 1332. If the corresponding entry exists, the second refresh counter 13331 is reset.

Accordingly, the second refresh operation might not be redundantly performed with respect to the address where the first refresh operation is performed.

The second refresh command generator 144 outputs the second refresh command R2CMD and the second refresh address R2ADDR to the memory device 10 according to the second refresh request R2R and the second refresh address R2ADDR output from the weakness detector 130.

The second refresh command R2CMD may include a sequentially provided active command and a precharge command.

Figure 7:
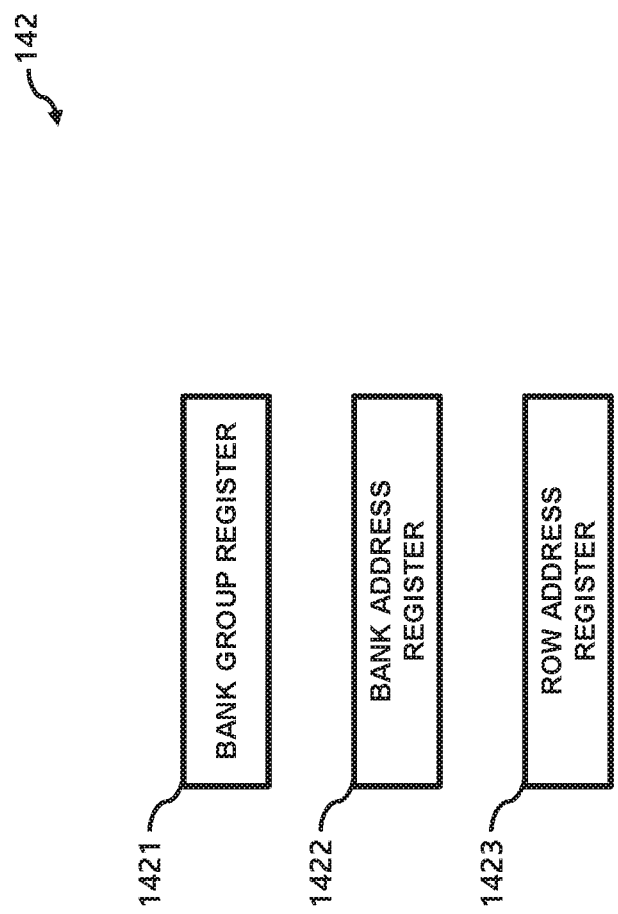
FIG. 7 is a block diagram illustrating a $2^{nd}$ register according to an embodiment of the present disclosure.

FIG. 7 is a block diagram illustrating a $2^{nd}$ register according to an embodiment of the present disclosure.

The second register 142 may include a bank group register 1421, a bank address register 1422, and a row address register 1423.

The second register 142 may extract a bank group, a bank address, and a row address from the most recently refreshed address and store the extracted bank group, bank address, and row address in the bank group register 1421, the bank address register 1422, and the row address register 1423.

FIGS. 8 to 14 are flow charts illustrating operations according to an embodiment of the present disclosure.

Figure 8:
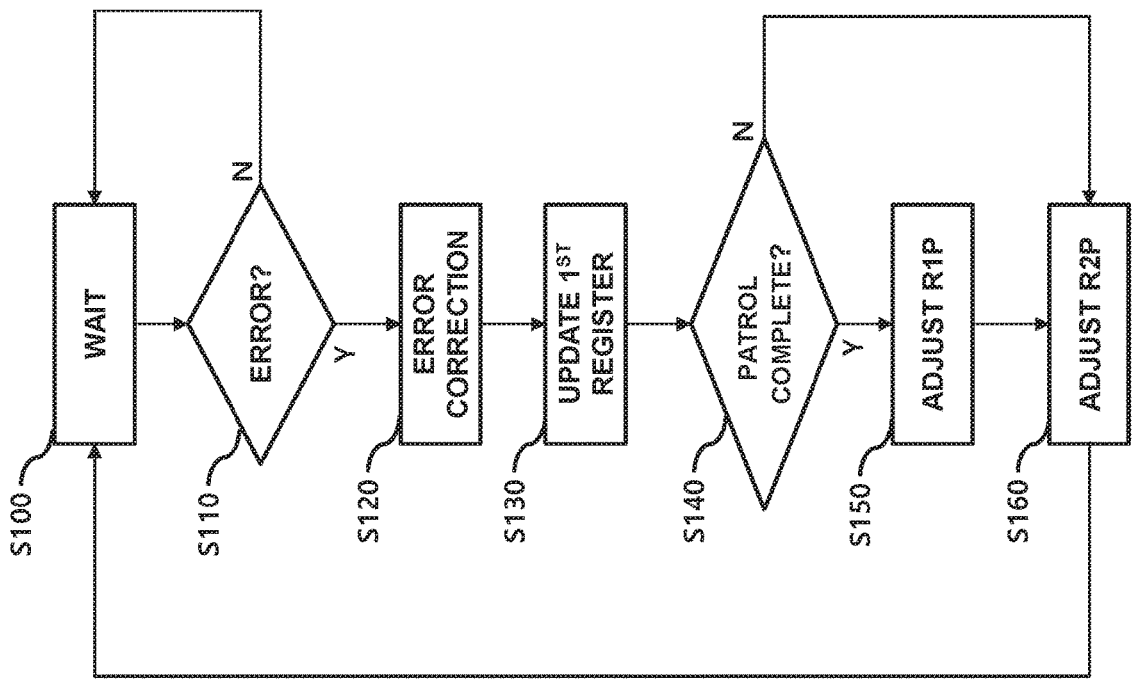
FIGS. 8 to 14 are flow charts illustrating operations according to an embodiment of the present disclosure.

FIG. 8 illustrates a method related to operations of the ECC circuit 110, the scrubbing circuit 120, and the weakness detector 130.

It is determined whether data read from the memory device 10 includes an error at step S110, and the process returns to the waiting state S100 if the data does not include an error.

If the data includes an error, the ECC circuit 110 corrects the error at step S120 and the scrubbing circuit 120 records the corrected error at step S120.

The weakness detector 130 updates the first register 1332 corresponding to the address where the error occurred at step S130.

It is determined whether the scrubbing circuit 120 completed a patrol operation at step S140, where a patrol operation may be a scrubbing operation.

When the scrubbing circuit 120 completes the patrol operation, the first refresh period is adjusted for the rank at step S150.

Thereafter, the weakness detector 130 adjusts the second refresh period stored in the first register 1332 at step S160 and the process returns to the wait state.

If the patrol operation is not completed at step S140, the second refresh period is adjusted at step S160 and the process returns to the wait state.

The method of adjusting the second refresh period is referred to in FIG. 4

Figure 9:
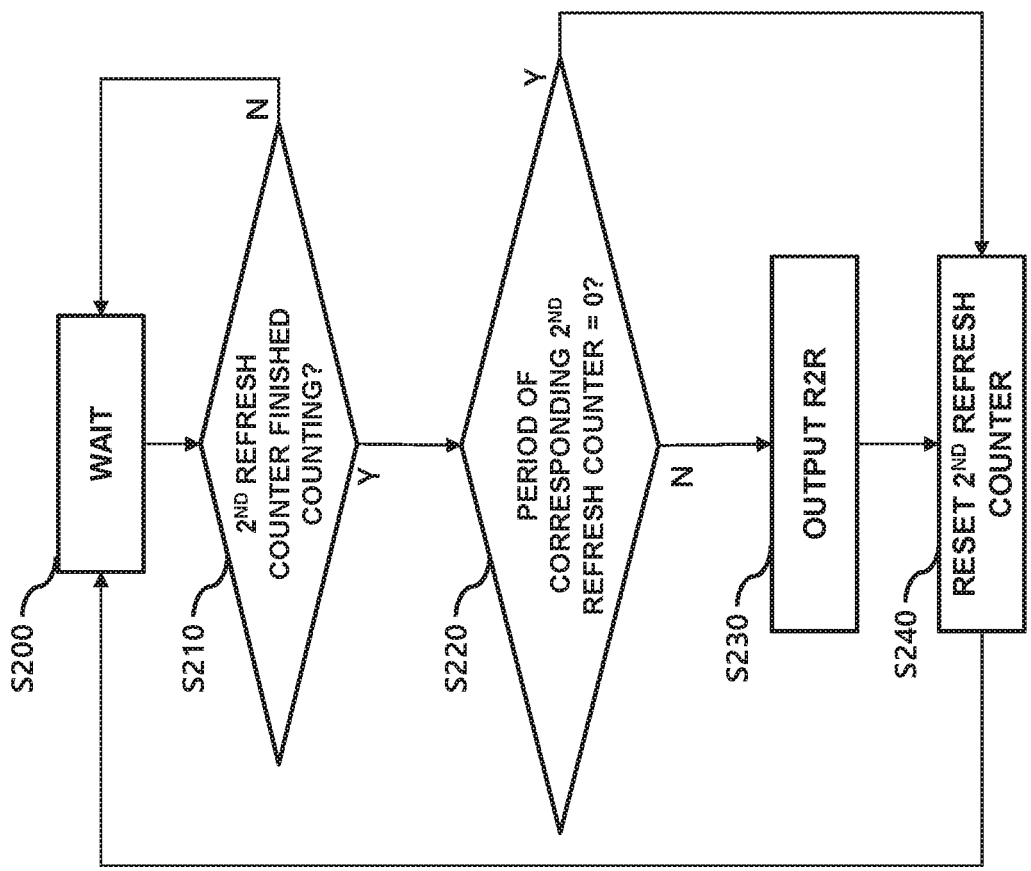

FIG. 9 illustrates a method related to generation of a second refresh request by the weakness detector 130.

At step S210, it is determined whether the second refresh counter has finished counting. If the counting has not finished, the process returns to the wait state S200.

If the second refresh counter has finished counting, it is determined whether the value of the corresponding second refresh period counter is 0 at step S220.

When the value of the corresponding second refresh period counter is 0, the second refresh counter is reset at step S240 and the process returns to the wait state S200 because the second refresh operation should not be performed.

When the value of the second refresh period counter is not zero, the weakness detector 130 outputs a second refresh request R2R for the corresponding second refresh address R2ADDR to the refresh controller 140 at step S230.

Then the second refresh counter is reset at step S240 and the process returns to the wait state S200.

Figure 10:
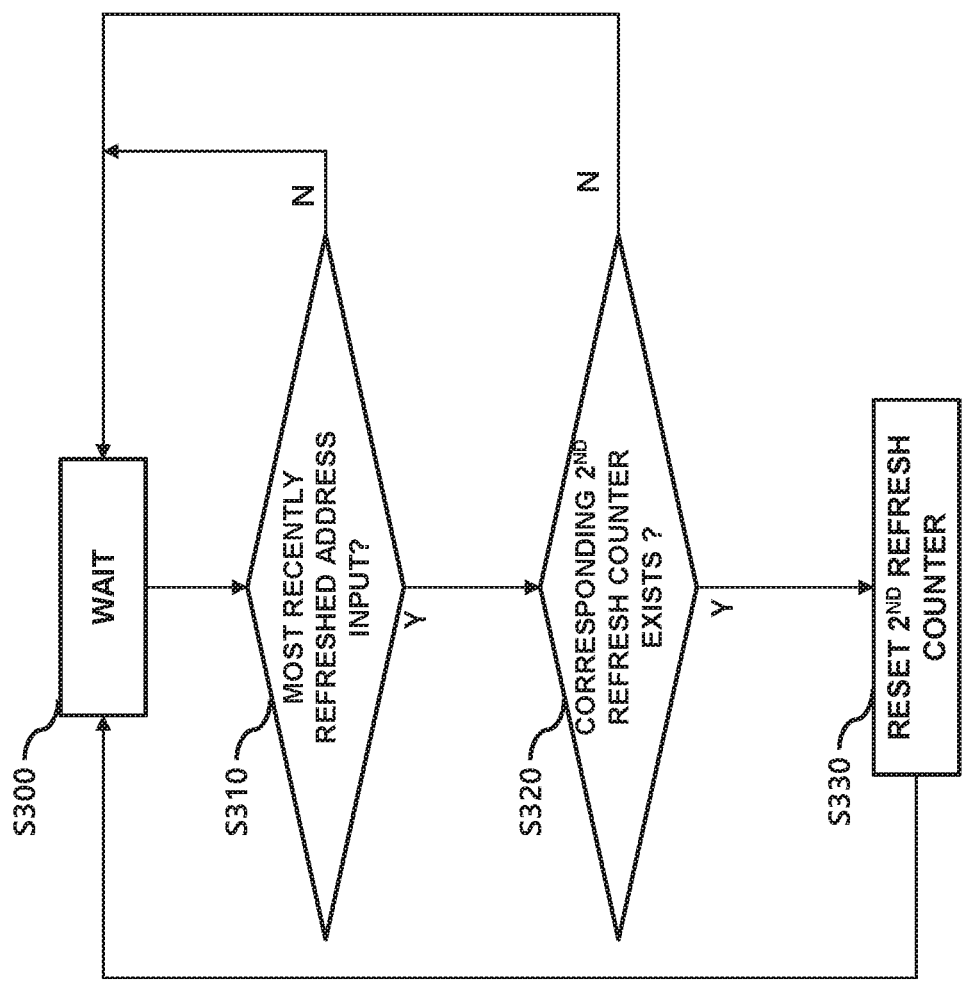

FIG. 10 illustrates a method related to the operation of the weakness detector 130 when the weakness detector 130 receives a most recently refreshed address.

At step S310, it is determined whether the most recently refreshed address is input. If the most recently refreshed address is not inputted, the process waits in the wait state S300.

If the most recently refreshed address is inputted, the weakness detector 130 is determines whether a corresponding second refresh counter exists at step S320.

If a corresponding second refresh counter exists, the second refresh counter is reset at step S330 and the process returns to the wait state S300.

Thus, the second refresh request is not performed again for the address that has been recently refreshed.

Figure 11:
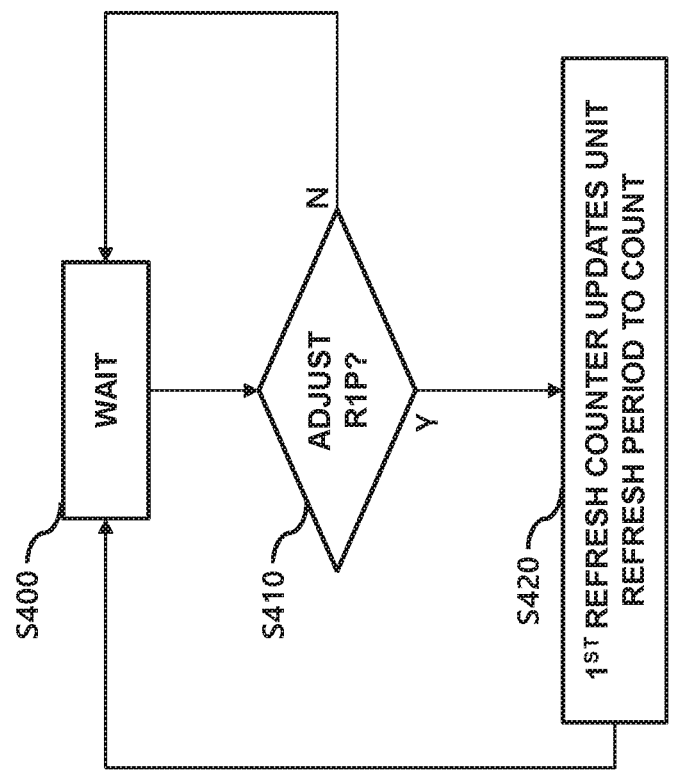

FIG. 11 illustrates a method related to operation of the refresh controller 140 when adjusting the first refresh period.

At step S410, it is checked whether there is an adjustment request for a first refresh period field R1P from the weakness detector 130 and the process waits in the wait state S400 when there is no request.

When there is a first refresh period adjustment request from the weakness detector 130, the refresh controller 140 updates the unit refresh period value to be counted by the first refresh counter at step S420.

The unit refresh period value may correspond to a value obtained by dividing the first refresh period value by the number of row addresses included in the rank.

Figure 12:
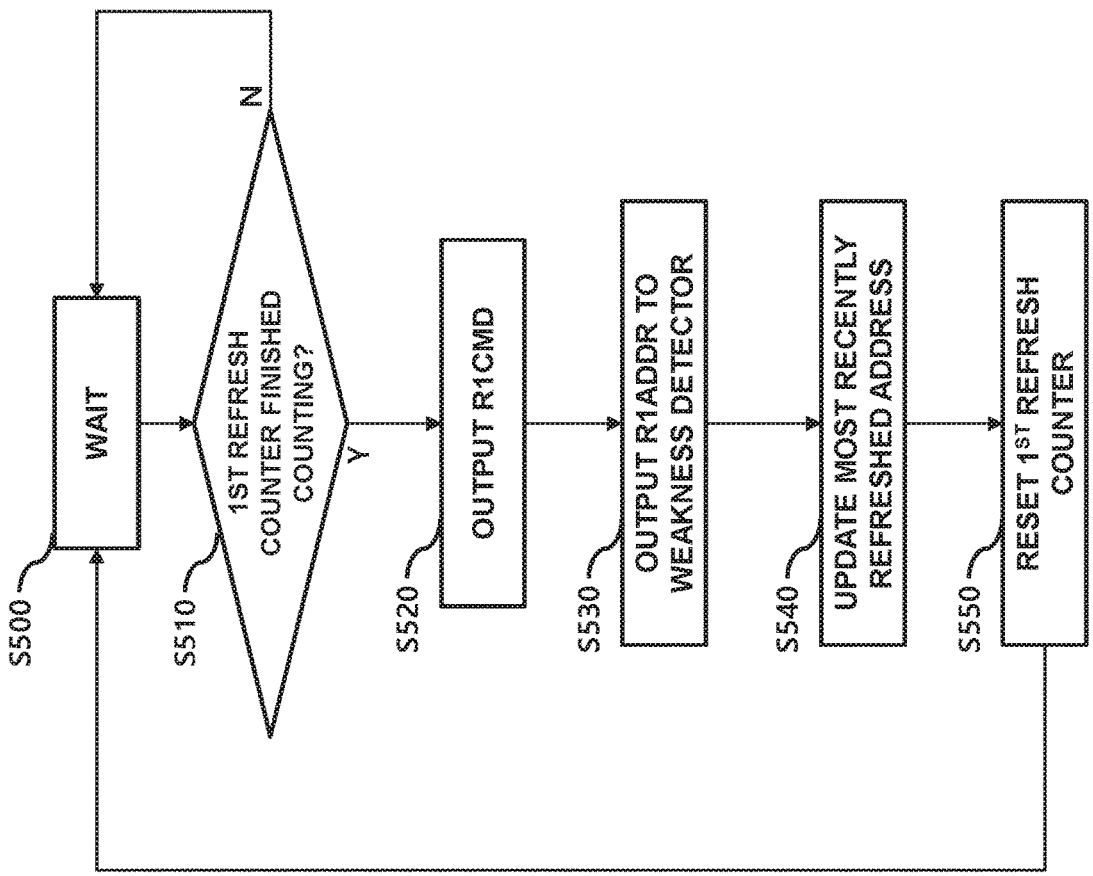

FIG. 12 illustrates a method associated with an operation of outputting a first refresh command by the refresh controller 140.

At step S510, the refresh controller 140 determines whether the first refresh counter has completed counting, and if the first refresh counter has not completed counting, the process waits in the wait state S500.

When the count is completed, the refresh controller 140 outputs the first refresh command R1CMD to the memory device 10 at step S520.

When refresh controller 140 outputs the first refresh command R1CMD, a refresh is automatically performed on the next address of the most recently refreshed address.

Thereafter, the first refresh address R1ADDR is output to the weakness detector 130 at step S530. At this time, the weakness detector 130 may perform the operation of FIG. 10.

Thereafter, the refresh controller 140 updates the most recently refreshed address at step S540 and resets the first refresh counter at step S550.

Figure 13:
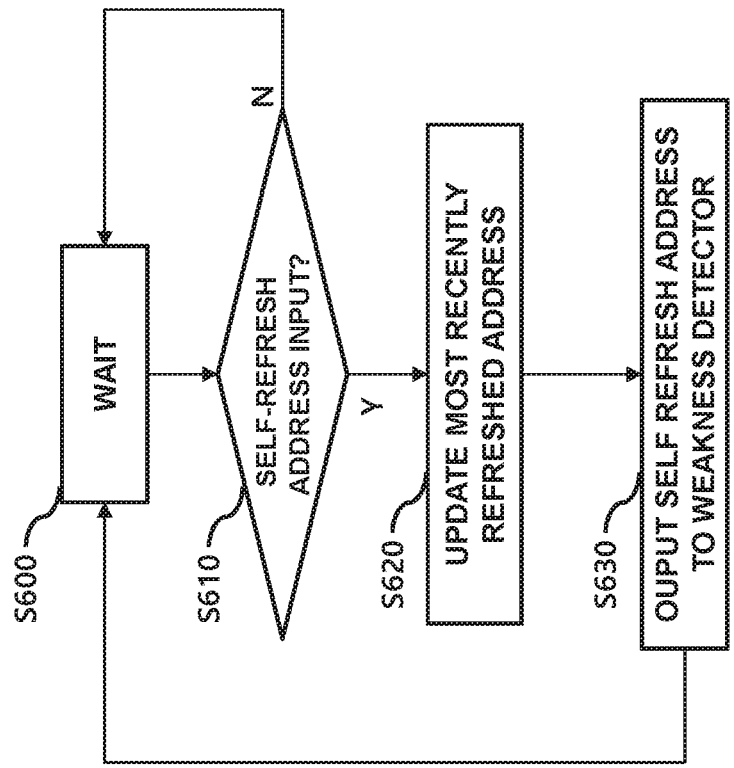

FIG. 13 illustrates a method related to operations in which the refresh controller 140 receives a self-refresh address from the memory device 10. In one example, the self-refresh address may be the third refresh address R3ADDR.

At step S610, a check is made to determine if the memory device 10 inputs a self-refresh address to the refresh controller 140. If the memory device 10 has not input the self-refresh address to the memory controller 140, the process waits in the wait state S600.

If the memory device 10 inputs the self-refresh address to the refresh controller 140, the refresh controller 140 updates the most recently refreshed address at step S620.

Then, the refresh controller 140 outputs the self-refresh address to the weakness detector 130 at step S630. At this time, the weakness detector 130 may perform the operation of FIG. 10.

Figure 14:
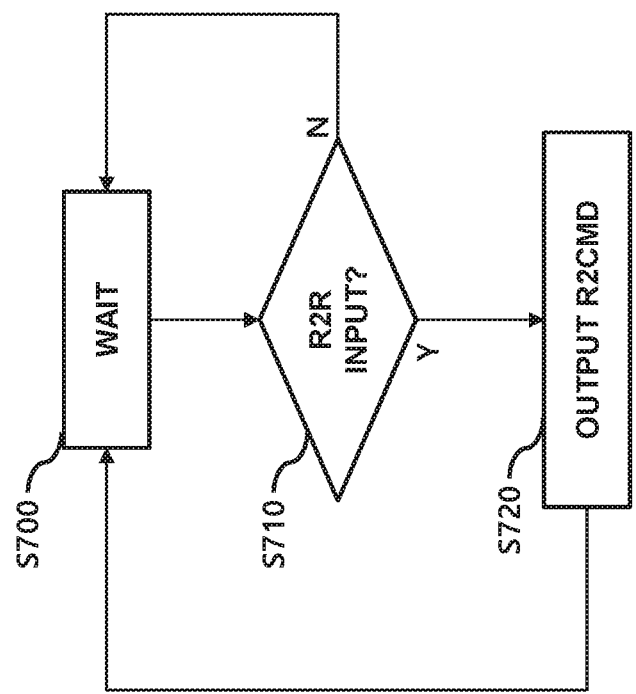

FIG. 14 illustrates a method associated with an operation in which the refresh controller 140 receives the second refresh address and the second refresh request from the weakness detector 130.

At step S710, the refresh controller 140 determines whether the weakness detector 130 communicated a second refresh request R2R to the refresh controller 140, and if the refresh controller 140 determines that a second refresh request R2R has not been inputted, the process waits in the wait state S700.

When the second refresh request R2R is input to the refresh controller 140, the refresh controller 140 outputs the second refresh command R2CMD to the memory device 10 at step S720.

Figure 15:
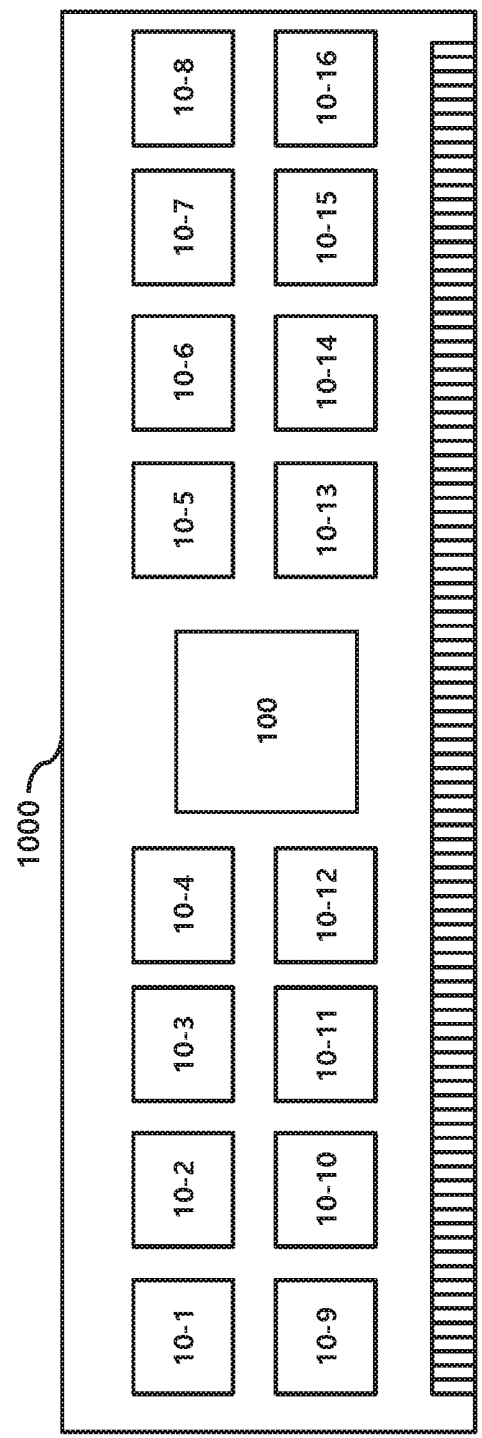
FIG. 15 is a diagram of a memory module including a semiconductor device according to an embodiment of the present disclosure.

FIG. 15 is a diagram of a memory module including a semiconductor device according to an embodiment of the present disclosure.

The semiconductor device 100 according to an embodiment of the present invention described with reference to FIG. 1 and the like may be mounted together with the memory devices 10-1 to 10-16 in the memory module 1000.

It is understood that the specific structure and function of the semiconductor device 100 are substantially the same as those described with reference to FIG. 1 etc.

FIG. 16 is a diagram of a stacked memory device including a semiconductor device according to an embodiment of the present disclosure.

The semiconductor device 100 according to an embodiment is disclosed with reference to FIG. 1 and the like and can be stacked together with a plurality of memory devices 10 in a stacked memory device 2000.

The memory device 10 and the semiconductor device 100 may be connected via Thru-Silicon Vias (TSVs).

It is understood that the specific structure and function of the semiconductor device 100 are substantially the same as those described with reference to drawings.

As disclosed above, the semiconductor device according to the present disclosure can variably control the refresh period during use of the memory device.

The semiconductor device according to the present disclosure can control the refresh unit of the memory unit differently, for example, the refresh cycle.

The semiconductor device according to the present disclosure can additionally perform a pseudo-refresh operation on a specific address of the memory device to actively cope with a change in the data retention characteristic of a specific cell.

Although various embodiments have been described for illustrative purposes, it will be apparent to those skilled in the art that various changes and modifications may be made without departing from the spirit and scope of the disclosure as defined in the following claims.

What is claimed is:

1. A semiconductor device, comprising:
a scrubbing circuit configured to perform a scrubbing operation for a memory device in reference to corrected data output from an error correction code (ECC) circuit;
a weakness detector configured to manage error occurrence information by dividing the memory device into a plurality of areas based on an address where an error occurred where the address is output from the scrubbing circuit, to control a first refresh period for a first refresh request at each of the plurality of areas based on the error occurrence information, and to generate a second refresh request for a second refresh address included in each of the plurality of areas based on the error occurrence information; and a refresh controller configured to generate a first refresh command according to the first refresh period and output the first refresh command to the memory device and to output a second refresh command and a second refresh address to the memory device according to the second refresh request and a second refresh address received from the weakness detector.

2. The semiconductor device of claim 1, wherein the weakness detector comprises a detection circuit including a plurality of sub-detection circuits, and
wherein each of the sub-detection circuits comprises:
a first register configured to manage the error occurrence information for a corresponding area; and
a control circuit configured to control the first refresh period for a corresponding area based on the first register and to generate the second refresh request for the second refresh address included in the corresponding area.

3. The semiconductor device of claim 2, wherein the weakness detector further comprises an address decoder specifying an area of the plurality of areas corresponding to an address.

4. The semiconductor device of claim 2, wherein the first register comprises a plurality of entries where each entry includes an address field, an error count field, and a second refresh period field.

5. The semiconductor device of claim 4, wherein the control circuit updates the first refresh period for the corresponding area by referring to the first register when the scrubbing operation is completed for the corresponding area.

6. The semiconductor device of claim 5, wherein the control circuit adjusts the first refresh period according to number of entries in the first register.

7. The semiconductor device of claim 4, wherein the control circuit adjusts a value of the second refresh period field according to a value of the error count field and a value of a first refresh period field.

8. The semiconductor device of claim 7, wherein the control circuit does not generate the second refresh request for an address when a value of the error count field is 0 or greater than a predetermined threshold value.

9. The semiconductor device of claim 4, wherein the sub-detection circuit further comprises a first counter array, and
wherein the first counter array comprises a plurality of second refresh counters corresponding to the plurality of entries and each of the plurality of second refresh counters counts a value of the second refresh period field included in a corresponding entry.

10. The semiconductor device of claim 9, wherein the refresh controller provides the first refresh address corresponding to the first refresh command to the weakness detector, and the control circuit resets a second refresh counter corresponding to an entry which includes the first refresh address.

11. The semiconductor device of claim 4, wherein each of the plurality of entries further comprise a flag field and wherein the control circuit activates the flag field when an uncorrectable error occurs or when a number of errors is greater than a predetermined value.

12. The semiconductor device of claim 1, wherein the refresh controller comprises a plurality of sub-refresh controllers corresponding to the plurality of areas, each of the sub-refresh controllers comprising:
a first refresh period counter configured to count a count value set according to a first refresh period of a corresponding area received from the weakness detector;
a second register configured to store a most recently refreshed address in the corresponding area;
a first refresh command generator configured to generate the first refresh command according to a counting operation of the first refresh period counter; and
a second refresh command generator configured to generate the second refresh command and a second refresh address according to the second refresh request and the second refresh address received from the weakness detector.

13. The semiconductor device of claim 12, wherein the count value corresponds to a value obtained by dividing the first refresh period by a number of row addresses included in the corresponding area.

14. The semiconductor device of claim 12, wherein each of the sub-refresh controllers updates a value of the second register and outputs an updated value to the weakness detector when the refresh controller outputs the first refresh command.

15. The semiconductor device of claim 12, wherein each of the sub-refresh controllers updates a value of the second register using a self-refresh address where a self-refresh operation is performed in the memory device.

16. The semiconductor device of claim 1, wherein each area of plurality of areas correspond to a rank of the memory device.

17. A memory system, comprising:
a memory device; and
a semiconductor device,
wherein the semiconductor device comprises:
a weakness detector configured to manage error occurrence information by dividing the memory device into a plurality of areas based on an address where an error has occurred output from a scrubbing circuit, to control a first refresh period for a first refresh request at each of the plurality of areas based on the error occurrence information and to generate a second refresh request for a second refresh address included in each of the plurality of areas based on the error occurrence information; and a refresh controller configured to generate a first refresh command according to the first refresh period, output the first refresh command to the memory device, and output a second refresh command and a second refresh address to the memory device according to the second refresh request and a second refresh address received from the weakness detector.

18. The memory system of claim 17, wherein the weakness detector comprises a detection circuit including a plurality of sub-detection circuits, and wherein each of the sub-detection circuits comprises:
a first register configured to manage error occurrence information for a corresponding area; and
a control circuit configured to control a first refresh period for the corresponding area with reference to the first register and to generate a second refresh request for a second refresh address included in the corresponding area.

19. The memory system of claim 17, wherein the refresh controller comprises a plurality of sub-refresh controllers corresponding to the plurality of areas, each of the sub-refresh controllers comprising:
a first refresh period counter configured to count a count value set according to a first refresh period of a corresponding area received from the weakness detector;
a second register configured to store a most recently refreshed address in the corresponding area;
a first refresh command generator configured to generate the first refresh command according to a counting operation of the first refresh period counter; and
a second refresh command generator configured to generate the second refresh command and a second refresh address according to the second refresh request and the second refresh address received from the weakness detector.

20. The memory system of claim 19, wherein the memory device provides a most recently self-refreshed address to the refresh controller when the memory device finishes a self-refresh operation, and each of the sub-refresh controllers updates a value of the second register using the most recently self-refreshed address.

21. A semiconductor device comprising:
a weakness detector configured to adjust a first refresh period for each of a plurality of areas included in a memory device and to generate a second refresh request for a second refresh address included in each of the plurality of areas; and a refresh controller configured to generate a first refresh command according to the first refresh period and output the first refresh command to the memory device, and to output a second refresh command and a second refresh address to the memory device according to the second refresh request and a second refresh address received from the weakness detector, wherein the refresh controller comprises a plurality of sub-refresh controllers corresponding to the plurality of areas, each of the sub-refresh controllers comprising:
a first refresh period counter configured to count a count value set according to a first refresh period of a corresponding area received from the weakness detector;
a second register configured to store a most recently refreshed address in the corresponding area;
a first refresh command generator configured to generate the first refresh command according to a counting operation of the first refresh period counter; and
a second refresh command generator configured to generate the second refresh command and the second refresh address according to the second refresh request and the second refresh address received from the weakness detector.

22. The semiconductor device of claim 21, wherein each of the sub-refresh controllers updates a value of the second register and outputs the value of the second register when the refresh controller outputs the first refresh command.

23. The semiconductor device of claim 21, wherein each of the sub-refresh controllers updates a value of the second register using a self-refresh address where a self-refresh operation is performed in the memory device.

24. The semiconductor device of claim 21, wherein when a scrubbing operation is completed in an area of the plurality of areas, the semiconductor device updates the first refresh period associated with the area.

25. The semiconductor device of claim 24, wherein the weakness detector comprises a detection circuit including a plurality of sub-detection circuits, and wherein each of the sub-detection circuits comprises:
a first register configured to manage error occurrence information for a corresponding area; and
a control circuit configured to control the first refresh period for the corresponding area with reference to the first register and to generate a second refresh request for a second refresh address included in the corresponding area.

26. The semiconductor device of claim 25, wherein when the scrubbing operation is completed in the corresponding area, the control circuit updates the first refresh period for the corresponding area by referring to the first register.

* * * * *